(12) United States Patent
Pratt et al.

(10) Patent No.: US 10,381,231 B2
(45) Date of Patent: Aug. 13, 2019

(54) ION BEAM ETCHING

(71) Applicant: Veeco Instruments Inc., Plainview, NY (US)

(72) Inventors: Timothy Pratt, Bayville, NY (US); Katrina Rook, Jericho, NY (US)

(73) Assignee: Veeco Instruments Inc., Plainview, NY (US)

( * ) Notice: Subject to any disclaimer, the term of this patent is extended or adjusted under 35 U.S.C. 154(b) by 43 days.

(21) Appl. No.: 15/594,876

(22) Filed: May 15, 2017

(65) Prior Publication Data

US 2017/0365485 A1 Dec. 21, 2017

Related U.S. Application Data

(60) Provisional application No. 62/352,839, filed on Jun. 21, 2016.

(51) Int. Cl.
| | |
|---|---|
| *H01L 21/3065* | (2006.01) |
| *H01L 21/308* | (2006.01) |
| *H01L 21/3105* | (2006.01) |
| *H01L 21/311* | (2006.01) |
| *H01L 21/02* | (2006.01) |
| *B82Y 40/00* | (2011.01) |
| *H01J 37/305* | (2006.01) |

(52) U.S. Cl.
CPC ...... *H01L 21/3065* (2013.01); *H01J 37/3053* (2013.01); *H01L 21/02008* (2013.01); *H01L 21/308* (2013.01); *H01L 21/3081* (2013.01); *H01L 21/31056* (2013.01); *H01L 21/31144* (2013.01); *B82Y 40/00* (2013.01); *H01J 2237/334* (2013.01)

(58) Field of Classification Search
None
See application file for complete search history.

(56) References Cited

U.S. PATENT DOCUMENTS

| | | | |
|---|---|---|---|
| 8,835,869 B2 | 9/2014 | Yevtukhov et al. | |
| 9,406,535 B2 | 8/2016 | Berry, III et al. | |
| 9,536,748 B2 | 1/2017 | Berry, III et al. | |
| 2009/0098306 A1* | 4/2009 | Druz | C23C 14/044 427/523 |
| 2012/0104274 A1* | 5/2012 | Hirayanagi | B82Y 10/00 250/424 |
| 2015/0004438 A1* | 1/2015 | Takizawa | G11B 5/855 428/832 |
| 2015/0090583 A1* | 4/2015 | Kodaira | H01J 37/32357 204/192.34 |
| 2016/0064232 A1 | 3/2016 | Berry, III et al. | |

* cited by examiner

*Primary Examiner* — Stephanie P Duclair
(74) *Attorney, Agent, or Firm* — Holzer Patel Drennan

(57) ABSTRACT

Pattern-multiplication via a multiple step ion beam etching process utilizing multiple etching steps. The ion beam is stationary, unidirectional or non-rotational in relation to the surface being etched during the etching steps, but sequential etching steps can utilize an opposite etching direction. Masking elements are used to create additional masking elements, resulting in decreased spacing between adjacent structures and increased structure density.

11 Claims, 3 Drawing Sheets

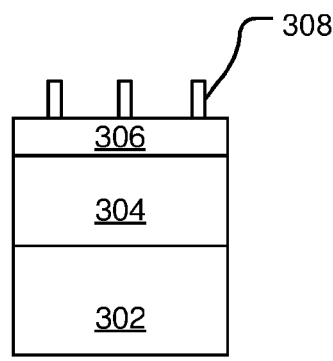
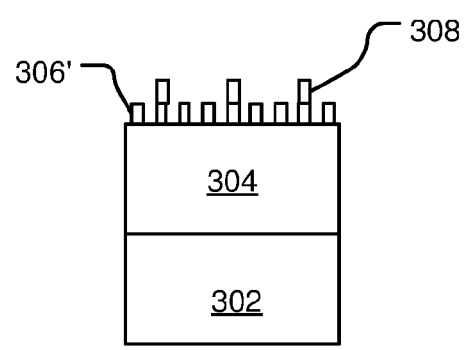
FIG. 3A  FIG. 3B
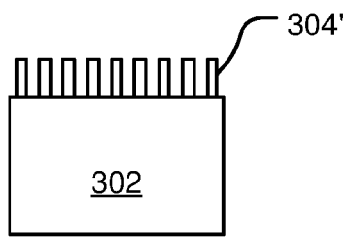
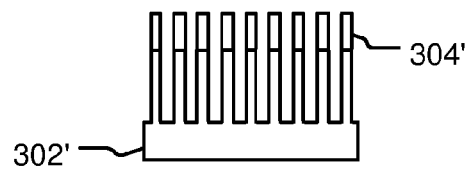
FIG. 3C  FIG. 3D
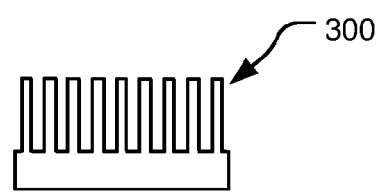
FIG. 3E

ION BEAM ETCHING

CROSS-REFERENCE

This application claims priority to U.S. Provisional application 62/352,839 filed Jun. 21, 2016, the entire disclosure of which is incorporated herein by reference.

BACKGROUND

Ion beam etching is a method of removing small (e.g., nanometer scale) amounts of material from a substrate such as a wafer. Often, a patterned mask such as a photoresist or a hard mask is applied to a surface, and then ion beam etching is used to remove the unmasked material, leaving the masked material.

In ion beam etching, the wafer, or other substrate being etched, can be rotated around a central axis during the etching process so that the angled ion beam has access to all sides of the feature being etched.

One of the major challenges facing semiconductor photolithography involves obtaining high density features, because typical printing processes for applying the mask cannot easily apply a pattern having a small spacing, less than about e.g., 28 nm, between adjacent features. Various alternate methods to obtain a spacing less than 28 nm between features have been attempted. For example, the mask can be applied in multiple, offset printing steps, to increase the density of features and thus decrease the spacing therebetween. As another example, an encapsulating coating or second mask can be applied over a first mask, after which the original mask is removed, thus creating two mask features for each first mask feature.

These methods can be difficult, complicated, and do not always provide acceptable features.

SUMMARY

The present disclosure is directed to multiple step ion beam etching processes that utilize masking elements to create additional masking elements, resulting in increased structure density and decreased spacing between adjacent structures. During the etching steps, the ion beam is not rotated but is stationary in relation to the surface being etched, but sequential etching steps utilize an opposite (e.g., 180 degree different) etching direction.

The processes of the present disclosure can additionally or alternately be described as patterning via multiple angled ion beam etching steps.

The density of the structures resulting from the multiple-step angled ion beam etching processes is greater than the density of the original structures by an odd multiple. In some implementations, the density of the structures is increased to three times the density of the original structures. In other implementations, the density of the structures is increased to five times the density of the original structures.

Additionally or alternatively, in some implementations, a center-to-center spacing between adjacent structures made by a multiple-step angled ion beam etching process is ⅓ of the center-to-center spacing of the original structures.

In one particular implementation, this disclosure provides a method that includes providing a substrate having at least two masking elements thereon, ion beam etching (without rotation) from a first direction at a first incidence angle and then ion beam etching (without rotation) from a second direction at the first incidence angle, the projection of the ion beam in the second direction being 180 degrees from the first direction. The method then includes ion beam etching from the first direction without rotation at a second incidence angle, and ion beam etching from the second direction without rotation but 180 degrees from the first direction at the second incidence angle.

In another particular implementation, a method includes providing a substrate having at least two masking elements thereon, ion beam etching (without rotation) the substrate from a first direction at a first incidence angle to provide a once-etched substrate, ion beam etching (without rotation) the once-etched substrate from a second direction with an angle of projection about 180 degrees from the first direction at the first incidence angle to provide a twice-etched substrate, ion beam etching the twice-etched substrate (without rotation) at a second incidence angle to provide a thrice-etched substrate, and ion beam etching (without rotation) the thrice-etched substrate with an angle of projection about 180 degrees from the direction of ion beam etching the twice-etched substrate, the etching the thrice-etched substrate occurring at the second incidence angle.

In another particular implementation, this disclosure provides a method that includes providing a substrate having a masking layer thereon and at least two masking elements on the masking layer. The method includes etching the masking layer in a first step at a first incidence angle without rotating the substrate relative to the etching. After the first step, then etching the etched masking layer in a second step at the first incidence angle without rotating the substrate relative to the etching, but with the second step done 180 degrees to the first step. After the second step, etching the etched masking layer again in a third step at a second incidence angle without rotating the substrate relative to the etching, the third step done 180 degrees to the first step or 180 degrees to the second step; and after the third step, etching the etched masking layer in a fourth step at the second incidence angle without rotating the substrate relative to the etching, but with the fourth step done 180 degrees to the third step.

In yet another particular implementation, this disclosure provides a method that includes providing a substrate having a first masking element and a second masking element thereon, then forming a first etched region by ion beam etching from a first direction, without rotation, using the first masking element as a shading structure and forming a second etched region and a third etched region by ion beam etching from a second direction, without rotation, 180 degrees from the first direction using the second masking element as a shading structure. The method continues by forming a fourth etched region by ion beam etching from the first direction, without rotation, using the first masking element and the first etched region as shading structures and then forming a fifth etched region by ion beam etching the masking layer from the second direction, without rotation, 180 degrees from the first direction using the second masking element and the second etched region as shading structures.

In yet another particular implementation, this disclosure provides a method that includes providing a substrate having a first masking element and a second masking element thereon, forming a first boundary of a first etched region by ion beam etching from a first direction without rotation using the first masking element as a shading structure, and forming a second boundary of the first etched region by ion beam etching from a second direction without rotation with an angle of projection about 180 degrees from the first direction using the second masking element as a shading structure. The method further includes forming a second etched region by ion beam etching from the first direction without rotation using the first masking element and the first etched region as shading structures, and then forming a third etched region by ion beam etching the masking layer from the second direction without rotation with an angle of projection about 180 degrees from the first direction using the second masking element and the second etched region as shading structures.

In any of the provided methods, the density of masking structures resulting from the multiple-step etching process is an odd multiple of the density of the initial masking elements. The new density may be, e.g., 3 times, 5 times, 7 times, etc. the initial element density. Increasing the density decreases the spacing between masking structures.

This Summary is provided to introduce a selection of concepts in a simplified form that are further described below in the Detailed Description. This Summary is not intended to identify key or essential features of the claimed subject matter, nor is it intended to be used to limit the scope of the claimed subject matter. These and various other features and advantages will be apparent from a reading of the following Detailed Description.

BRIEF DESCRIPTION OF THE DRAWING

FIGS. 3A through 3E are step-wise, schematic side views of an example structure formed using ion beam etching techniques of this disclosure.

DETAILED DESCRIPTION

Figure 1:
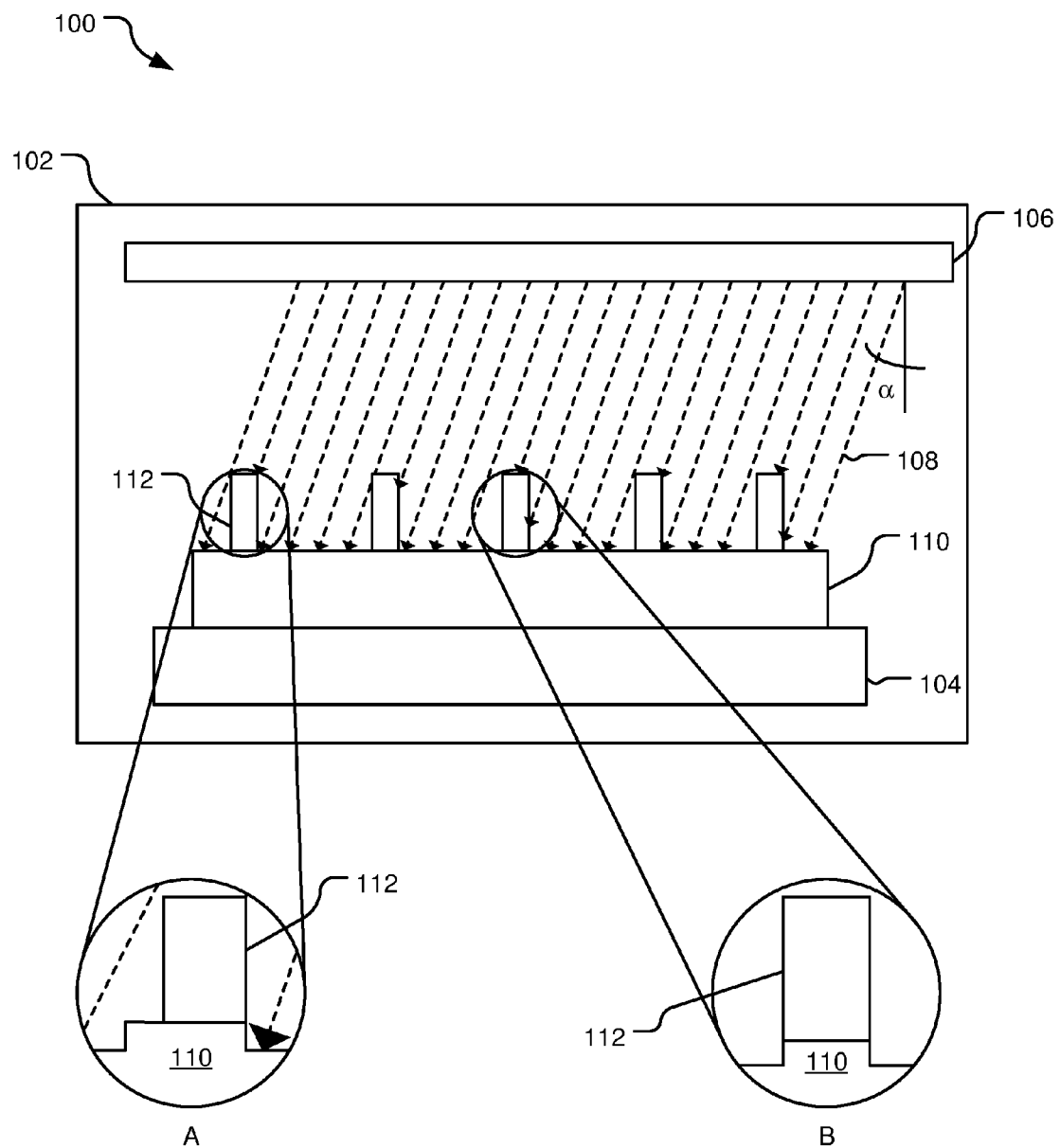
FIG. 1 is a schematic diagram of an example of an ion beam etching system.

This disclosure provides methods for obtaining a high density pattern (e.g., less than 28 nm between adjacent structures, e.g., 7 nm between adjacent structures) using an ion beam etch process on the substrate after applying a mask on the substrate. The mask (or other masking or shadowing structure) forms secondary masking features, which together, are used to form more final structures than the originally-present masking features.

In accordance with the methods described herein, the substrate being etched is not rotated (either continuously or at all) in relation to the ion beam during the etching process; that is, etching does not occur during rotation of the substrate or ion beam. Rather, the substrate and the ion beam are fixed, or essentially fixed, in relation to each other during etching. Only between etching steps is the ion beam direction changed in relation to the substrate. Angled etching, using the masking element to partially shade the substrate, is done at 180 degree opposing projection angles. Ideally, subsequent etching steps are done at a projection angle 180 degrees from the previous process, however, due to structure undercut which is inherent in the actual process, the actual projection angle may be, e.g., up to 1-2 degrees, off from 180 degrees to accommodate and optimize the sidewall angle.

In some implementations, subsequent etching steps are done at a different, e.g., larger, incident angle.

During each etching step, the wafer may scan past the ion source (e.g., to improve uniformity), while maintaining a fixed incidence angle of the ion beam.

The following description provides additional specific implementations. It is to be understood that other implementations are contemplated and may be made without departing from the scope or spirit of the present disclosure. The following detailed description, therefore, is not to be taken in a limiting sense. While the present disclosure is not so limited, an appreciation of various aspects of the disclosure will be gained through a discussion of the examples provided below.

In the following description, reference is made to the accompanying drawing that forms a part hereof and in which are shown by way of illustration at least one specific implementation. In the drawing, like reference numerals may be used throughout several figures to refer to similar components. In some instances, a reference numeral may have an associated sub-label consisting of a lower-case letter to denote one of multiple similar components. When reference is made to a reference numeral without specification of a sub-label, the reference is intended to refer to all such multiple similar components.

Ion beam etch or etching is a process that utilizes an inert gas plasma (e.g., neon, argon) to bombard a substrate with ions and remove substrate material. Although the following discussion uses the phrase "ion beam etch" or variants thereof (e.g., ion beam etching, IBE) alternate phrases that can be used include ion beam milling, ion beam sputtering, focused ion beam, and variants thereof. Further, although IBE is used throughout, the processes described herein may also be done via reactive ion beam etch (RIBE) from a mixture of plasma based on inert gas, halocarbon, etc. or by chemically assisted ion beam etch (CAIBE) where the reactive gas is introduced into the etch chamber separate from the plasma source.

FIG. 1 illustrates schematically a generic ion beam etching system 100. The system 100 has a chamber 102 with a platen 104 for supporting a substrate, such as a wafer 110, e.g., a silicon (Si) wafer, a semiconductor wafer, a sapphire wafer, etc. The platen 104, and the wafer 110, can be configured to rotate about a central axis of the platen 104. Also within the chamber 102 is an ion beam source 106, configured to emit ions in the form of beams 108 toward the platen 104 and the wafer 110. As indicated above, FIG. 1 is a very generic schematic of an ion beam etch system, and a working ion beam etch system includes other features not illustrated in FIG. 1, such as a plasma source, a target, intake and exhaust systems, and other equipment that is generally found in an ion beam etch system. FIG. 1 merely illustrates generic elements that facilitate the description of the ion beam etching methods below.

The ion beam source 106 is configured to emit the ion beam 108 at an angle to the substrate 110 (other than straight down, or vertical, on to the substrate 110). This angle of incidence is measured from the vertical and is illustrated in FIG. 1 as angle α. The angle of incidence a is greater than 1 degree and less than 90 degrees. The ion beam source 106 and its position and orientation in relation to the platen 104 and the wafer 110 is sufficiently accurate to control the angle of incidence a to within less than 1 degree, often less than 0.1 degree. Examples of common angles of incidence a include 6 degrees, 10 degrees, 12 degrees, 15 degrees, and 30 degrees, although other angles can be used.

Present on the wafer 110 is at least one masking or mask element 112; in the illustrated implementation, five mask elements 112 are shown, although other implementations may have more or less. The mask element 112 may be, for example, a hard mask or a photoresist. Individual mask elements 112, in this implementation, are separated by at least about 28 micrometers. The mask element 112 can be applied to the wafer 110 by any known process. Lithograph printing is one common method for applying the mask element 112.

During an etching process, the ion beam 108 removes material from the surface of the wafer 110 that is not covered by or otherwise shielded by the mask elements 112. During this etching, the platen 104 and wafer 110 are stationary in relation to the ion beam source 106 and the ion beam 108; that is, there is no relative rotation in the processes of this disclosure, as is common with ion beam etching systems. Due to the angle of incidence a of the ion beam 108, the mask element 112 shades a portion of the wafer 110 from the beam 108. In general, the thicker (higher the structure of) the mask element 112, the larger the shaded area of the wafer 110 on the side opposite the ion beam 108. An example thickness for the mask element 112 is 100 nm for a photoresist material and about 25 nm for a hard mask material, although thicker and thinner masks 112 are known and can be used. Similarly, the greater the incident angle of the ion beam 108, the larger the shaded area of the wafer 110. Inset A of FIG. 1 illustrates a mask element 112 shading a portion of the wafer 110, thus resulting in the shaded portion of the wafer surface not being etched.

As indicated above, the platen 104 can be configured to rotate about a central axis. By rotating the platen 104 and wafer 110 (e.g., through 360 degrees, often multiple rotations) during the etching process, as is conventionally done, no portion of the wafer 110 is shaded from the ion beam 108 by the mask elements 112. Thus, by rotating the wafer 110 during the etching process, ideally no area on the surface of the wafer 110 is shaded by the mask element 112 and all unmasked surfaces of the wafer 110 are etched essentially equally, resulting in the structure shown schematically in Inset B of FIG. 1.

By using the mask element 112 to shade an area of the wafer 110 during etching without rotation (e.g., 360 degree rotation), uneven etching of the wafer 110 is obtained. Applicant found that the physical features left by this uneven etching can be used to form additional masking features between individual mask elements 112, thus increasing the density of masking features and decreasing the distance between adjacent mask features.

FIGS. 2A through 2D illustrate step-wise use of a mask or masking element as a designed shade or masking element for a subsequent etch step.

Figure 2A:
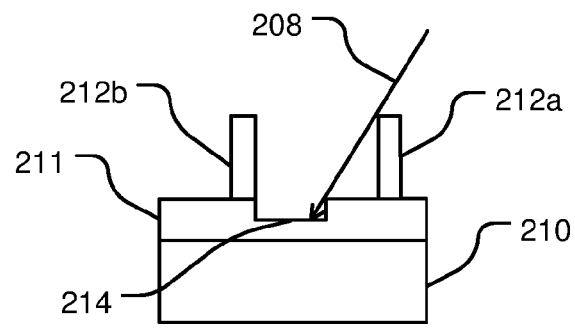
FIGS. 2A through 2D are step-wise, schematic side views illustrating ion beam etching using the techniques of this disclosure.

FIG. 2A illustrates a wafer 210 having a mask layer 211 thereon, with multiple masking elements 212, particularly masking element 212a and masking element 212b, on the mask layer 211. The masking elements 212 have been applied via a conventional process (e.g., photolithography or a printing process) and have a distance of at least 28 nm therebetween, e.g., 35 nm. In the illustrated implementation, the mask layer 211 has a thickness (measured from the wafer 210) of about 10 nm whereas the masking elements 212 have a thickness (height) of about 25 nm. As described above in respect to FIG. 1 and Inset A, the masking elements 212 shade a portion of the surface of the mask layer 211 from an ion beam 208 hitting at a first incident angle, when there is no rotation of the wafer 210 relative to the ion beam 208 (e.g., the ion beam 208 is unidirectional). The result is a first etched region 214, illustrated at the base at the right side of masking element 212b, the first etched region 214 extending from the base of the element 212b toward the element 212a but short of the element 212a due to the shading or shadowing caused by the masking element 212a; although not illustrated, a similar etched first region would be at the right base of the masking element 212a, due to a masking element that is not illustrated but that would be farther to the right in the figure. The wafer 210 is now "once-etched", having the first etched region 214 formed by the single etching step and having a depth (of "x").

Figure 2B:
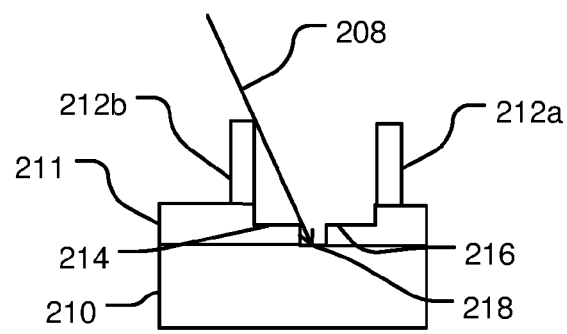

In a next step, shown in FIG. 2B, the once-etched wafer 210 is rotated relative to the ion beam 208 about 180 degrees (either the wafer 210 is rotated in relation to the ion beam 208 or the ion beam source is rotated in relation to the wafer 210). In this step, the angle of incidence or projection of the ion beam 208 is essentially the same as, or within 1-2 degrees of the angle of incidence in the first step of FIG. 2A, except that is it from the opposite direction. In an ideal situation, the angle of incidence will be exactly the same in the two steps (of FIGS. 2A and 2B), however, a portion of the masking elements 212 will erode during each etch step, so the angle of the second etch step will not necessarily be the same as the first angle due to this mask erosion. Any amount of mask erosion needs be understood and the subsequent etch angles should be selected so that they compensate for the mask erosion.

Again, the masking elements 212 shade a portion of the surface of the mask layer 211 from the unidirectional ion beam 208 that is hitting at a first incidence angle without any rotation of the wafer relative to the ion beam 208. This results in a twice-etched wafer having a second etched region 216 of a depth ("x") similar to the depth of the first etched region 214 (assuming the etching conditions were the same in the step of FIG. 2A and the step of FIG. 2B), the second region 216 being present in the location that was shaded in the first step (in FIG. 2A), at the base at the left side of the masking element 212a and extending toward element 212b. Although not illustrated, a similar etched second region would be at the left base of the masking element 212b, due to a mask element that is not illustrated but that would be to the left of the figure. Thus, both the first region 214 and the second region 216 have had one exposure to the ion beam 208.

A third etched region 218 results in the step illustrated in FIG. 2B at the location where the first region 214 and the second region 216 overlap; this third etched region 218 has had two exposures to the ion beam 208, a first exposure in the step of FIG. 2A and a subsequent exposure in the step of FIG. 2B when the beams 208 are 180 degrees to each other. This third etched region 218 has a depth approximately twice that of the first etched region 214 and the second etched region 216, or, about "2x." This third region 218 is illustrated equidistant between the masking element 212a and the masking element 212b, although in other implementations, it may not be. The width of the third region 218 is determined by the angle of incidence of the ion beam 208.

Figure 2C:
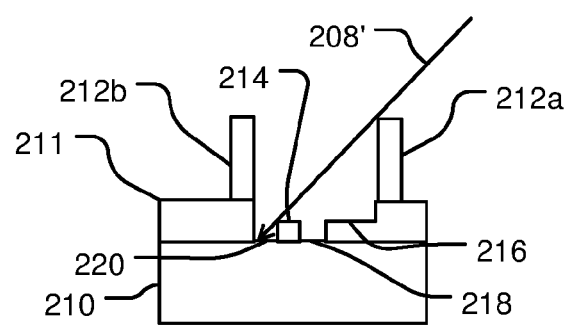

In a next step, shown in FIG. 2C, the twice-etched wafer 210 is again rotated relative to the ion beam 208 an amount of 180 degrees, back to the original position as in the step of FIG. 2A. In this step of FIG. 2C, the angle of incidence of the ion beam 208' is approximately twice the angle of incidence as in the steps of FIGS. 2A and 2B (e.g., if the angle of incidence in FIGS. 2A and 2B is about 15 degrees, in this step of FIG. 2C it is about 30 degrees). Again, the masking elements 212 shade a portion of the surface from ion beam 208'; FIG. 2C shows masking element 212a shading a portion of the surface. In this step however, the surface being etched is the first etched region 214 (that was etched in FIG. 2A); this results in a fourth etched region 220, with a portion of the original first etched region 214 remaining due to it being shaded by the masking element 212a. This fourth region 220, on the thrice-etched wafer, has a depth approximately twice that of the first region 214 and the second region 216, or, about "2x."

Figure 2D:
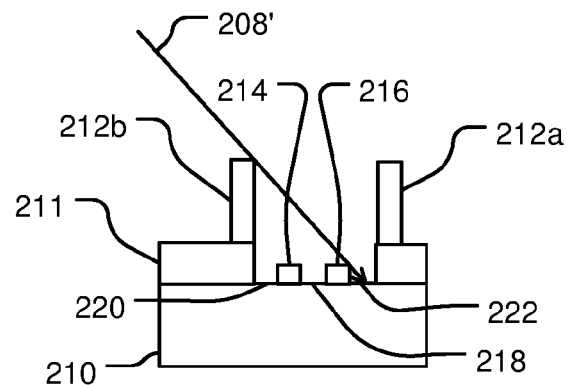

Next, in the step shown in FIG. 2D, the thrice-etched wafer 210 is again rotated relative to the ion beam 208' 180 degrees, back to the position as in the step of FIG. 2B. In this step, the angle of incidence of the ion beam 208' is the same as, or at least within 1-2 degrees, of the angle of incidence in the third step of FIG. 2C, approximately twice the angle of incidence of the steps of FIGS. 2A and 2B. Again, the masking elements 212 shade a portion of the surface from ion beam 208'; FIG. 2D shows masking element 212b shading a portion of the surface. In this step, the surface being etched is the second etched region 216; this results in a fifth etched region 222, with a portion of the original second etched region 216 remaining due to it being shaded by the masking element 212b. Similar to the fourth region 220, the fifth region 222 has a depth approximately twice that of the first region 214 and the second region 216, or, about "2×."

As seen in FIG. 2D, the four step etching process, with two steps done from opposite directions, results in two structures (the remainder of the first etched region 214 and the second etched region 216) positioned between the masking elements 212a, 212b. The process can alternately be described as a process with two pairs of etching steps, with each step of a pair done from opposite directions. These two structures (remaining regions 214, 216) can be used as masking elements for a subsequent etching process, in effect, significantly increasing the density of masking elements (compared to the initial number of masking element) and decreasing the spacing between adjacent masking elements (again, compared to the initial spacing between adjacent masking elements) due to the two additional masking structures. As an example, if an original distance of 30 nm was between (center to center) the original masking elements 212a, 212b, the distance between elements 212 and the two additional elements 214, 216 (specifically, between element 212b and element 214, between element 214 and element 216, and element 216 and element 212a) is now 10 nm; as another example, if 42 nm is between (center to center) the original masking elements 212, the distance between adjacent elements 212 and the two additional elements 214, 216 is now 12 nm.

In an alternate implementation, the ion beam 208' of FIG. 2C and FIG. 2D is switched in direction, so that in FIG. 2C the projection of the ion beam 208' is from the same direction as the ion beam 208 in FIG. 2B and then the ion beam 208' in FIG. 2D is from the same direction as the ion beam 208 in FIG. 2A.

In some implementations, additional etching steps or pairs of etching steps could be subsequently done, thus forming further masking structures or masking elements. With each subsequent pair of etching steps, additional masking structures or elements are formed.

FIGS. 3A through 3E illustrate an example process for forming an example structure using ion beam etching as per the present processes.

In FIG. 3A, a substrate 302 is provide having two continuous hard masks 304, 306 and a patterned mask having masking elements 308. The masking elements 308 have been applied onto the hard mask 306 by any conventional method, such as photolithography. It is understood that the hard masks 304, 306 and masking elements 308 are chosen to selectively etch or withstand the following process steps. Other masks and masking elements can be used that would modify the example processes described herein.

Using a four step (or, two pair step) process such as described above in respect to FIGS. 2A through 2D, additional or secondary masking elements 306' are formed from the hard mask 306, shown as masking elements 306' in FIG. 3B. Two of these masking elements 306' are present between the original masking elements 308, thus tripling the density of available masking elements and decreasing the center-to-center distance between adjacent elements by ⅓.

The original masking elements 308 and the masking elements 306' are used as a mask for an etching process (e.g., reactive ion etch (ME)) that utilizes a vertical etch (having an incidence angle of zero). In the particular implementation illustrated, the vertical etching process etches into the hard mask 304 and removes masking elements 306' and 308. The resulting structures, masking elements 304' shown in FIG. 3C, are formed from the hard mask 304. The resulting masking elements 304' are more densely packed and have less distance therebetween, than the initial masking elements 308, and have essentially equal height across them.

A subsequent etching process such as a vertical ME, performs a deep etch into the substrate 302 using the masking elements 304'. The result, shown in FIG. 3D, is a patterned substrate 302' with the masking elements 304' remaining on the etched substrate 302'. In a subsequent step, the masking elements 304' are removed and the resulting structure 300 is illustrated in FIG. 3E. This resulting structure 300 has a more dense arrangement of features than the original masking elements 308 with a closer spacing therebetween.

The above specification and examples provide a complete description of the process and use of exemplary implementations of the invention. The above description provides specific implementations. It is to be understood that other implementations are contemplated and may be made without departing from the scope or spirit of the present disclosure. The above detailed description, therefore, is not to be taken in a limiting sense. While the present disclosure is not so limited, an appreciation of various aspects of the disclosure will be gained through a discussion of the examples provided.

Unless otherwise indicated, all numbers expressing feature sizes, amounts, and physical properties are to be understood as being modified by the term "about." Accordingly, unless indicated to the contrary, the numerical parameters set forth are approximations that can vary depending upon the desired properties sought to be obtained by those skilled in the art utilizing the teachings disclosed herein.

As used herein, the singular forms "a", "an", and "the" encompass implementations having plural referents, unless the content clearly dictates otherwise. As used in this specification and the appended claims, the term "or" is generally employed in its sense including "and/or" unless the content clearly dictates otherwise.

Spatially related terms, including but not limited to, "lower", "upper", "beneath", "below", "above", "on top", etc., if used herein, are utilized for ease of description to describe spatial relationships of an element(s) to another. Such spatially related terms encompass different orientations of the device in addition to the particular orientations depicted in the figures and described herein. For example, if a structure depicted in the figures is turned over or flipped over, portions previously described as below or beneath other elements would then be above or over those other elements.

Since many implementations of the invention can be made without departing from the spirit and scope of the invention, the invention resides in the claims hereinafter appended. Furthermore, structural features of the different implementations may be combined in yet another implementation without departing from the recited claims.

What is claimed is:

1. A method comprising:
providing a substrate having a first masking element and a second masking element thereon, the first masking element separated from the second masking element along a surface of the substrate;
forming a first etched region by unidirectional ion beam etching the substrate from a first projection direction using the first masking element as a shading structure;
forming a second etched region and a third etched region by unidirectional ion beam etching from a second projection direction with an angle of projection about 180 degrees from the first projection direction using the second masking element as a shading structure;
forming a fourth etched region by unidirectional ion beam etching using the first masking element and the first etched region as shading structures;
forming a fifth etched region by unidirectional ion beam etching from the second projection direction with an angle of projection about 180 degrees from the projection direction used for forming the fourth etched region, using the second masking element and the second etched region as shading structures;
resulting in a third masking element and a fourth masking element between the first masking element and the second masking element.

2. The method of claim 1, wherein forming a first etched region and forming a second etched region are at a first incidence angle, and forming a fourth etched region and forming a fifth etched region are at a second incidence angle different than the first incidence angle.

3. The method of claim 2, wherein the second incidence angle is about twice the first incidence angle.

4. The method of claim 1, wherein forming a fourth etched region is from the first projection direction, and forming a fifth etched region is from the second projection direction.

5. The method of claim 1, wherein forming a fourth etched region is from the second projection direction, and forming a fifth etched region is from the first projection direction.

6. The method of claim 1, wherein the density of the first masking element, the second masking element, the third masking element and the fourth masking element is 3 times the density of the first masking element and a second masking element.

7. A method comprising:
providing a substrate having a first masking element and a second masking element thereon, the first masking element separated from the second masking element along a surface of the substrate;
unidirectionally etching the substrate from a first projection direction at a first incidence angle;
unidirectionally etching the substrate from a second projection direction with an angle of projection about 180 degrees from the first projection direction at the first incidence angle;
unidirectionally etching the substrate at a second incidence angle to form a third masking element on the substrate between the first masking element and the second masking element; and then
unidirectionally etching the substrate with an angle of projection about 180 degrees from the projection direction of the previous etching at the second incidence angle to form a fourth masking element on the substrate between the first masking element and the second masking element.

8. The method of claim 7, wherein a density of the first masking element, the second masking element, the third masking element and the fourth masking element is 3 times the density of the first masking element and a second masking element.

9. The method of claim 7, wherein the second incidence angle is about twice the first incidence angle.

10. The method of claim 7, wherein unidirectionally etching the substrate at a second incidence angle to form a third masking element is from the first projection direction, and unidirectionally etching the substrate at the second incidence angle to form a fourth masking element is from the second projection direction.

11. The method of claim 7, wherein unidirectionally etching the substrate at a second incidence angle to form a third masking element is from the second projection direction, and unidirectionally etching the substrate at the second incidence angle to form a fourth masking element is from the first projection direction.

* * * * *